United States Patent [19]
Liu et al.

[11] Patent Number: 6,143,657
[45] Date of Patent: Nov. 7, 2000

[54] METHOD OF INCREASING THE STABILITY OF A COPPER TO COPPER INTERCONNECTION PROCESS AND STRUCTURE MANUFACTURED THEREBY

[75] Inventors: Chung-Shi Liu, Hsinchu; Chen-Hua Yu, Hsin-Chu, both of Taiwan

[73] Assignee: Taiwan Semiconductor Manufacturing Company, Hsin-Chu, Taiwan

[21] Appl. No.: 09/225,063

[22] Filed: Jan. 4, 1999

[51] Int. Cl.[7] .............................. H01L 21/44; H01L 29/43
[52] U.S. Cl. .......................... 438/687; 438/626; 438/627; 438/637; 438/668; 257/751; 257/758; 257/774; 257/915
[58] Field of Search .................. 438/687, 632, 438/637, 668, 643, 644, 661, 674, 626, 627; 257/751, 762, 915, 750, 752, 758, 774

[56] References Cited

U.S. PATENT DOCUMENTS

| | | | |
|---|---|---|---|
| 4,931,410 | 6/1990 | Tokanaga et al. | 437/189 |
| 4,985,750 | 1/1991 | Hoshino | 357/71 |
| 5,120,572 | 6/1992 | Kumar | 437/60 |
| 5,283,206 | 2/1994 | Sugano | 437/194 |
| 5,288,456 | 2/1994 | Aboelfotoh et al. | 420/469 |
| 5,420,069 | 5/1995 | Joshi et al. | 438/652 |
| 5,674,787 | 10/1997 | Zhoa et al. | 438/687 |
| 5,695,810 | 12/1997 | Dubin et al. | 438/687 |
| 5,731,245 | 3/1998 | Joshi et al. | 438/705 |
| 5,909,637 | 6/1999 | Charneski et al. | 438/687 |
| 6,046,108 | 4/2000 | Liu et al. | 438/687 |
| 6,083,829 | 7/2000 | Lai et al. | 438/687 |

*Primary Examiner*—Matthew Smith
*Assistant Examiner*—Igwe U. Anya
*Attorney, Agent, or Firm*—George O. Saile; Stephen B. Ackerman; Graham S. Jones, II

[57] ABSTRACT

A via is formed between a copper conductor and a second copper conductor in a thin film electronic device with a copper plug interconnecting the copper conductor and the second copper conductor. Form a stop layer over the first copper conductor and a dielectric layer over the stop layer. Pattern the dielectric and etch stop layers by etching a hole therethrough down into a copper conductor leaving an exposed surface of the copper conductor and exposed sidewalls of the dielectric layer and the etch stop layer. Grow a copper germanide ($Cu_3Ge$) compound, thin film at the base of the hole on the exposed surface of the copper conductor from exposure to germane $GeH_4$ gas. Form a barrier layer over the copper germanide ($Cu_3Ge$) compound, thin film, the dielectric layer and the first copper conductor. The barrier layer forms a via hole in the hole. Form a second copper conductor including the copper plug over the barrier layer, the copper plug filling the narrow via hole.

15 Claims, 3 Drawing Sheets

METHOD OF INCREASING THE STABILITY OF A COPPER TO COPPER INTERCONNECTION PROCESS AND STRUCTURE MANUFACTURED THEREBY

BACKGROUND OF THE INVENTION

1. Field of the Invention

This invention relates to electrical and mechanical interconnections between copper conductors and other copper conductors in a thin film semiconductor device and more particularly to an interface between the two copper conductors.

2. Description of Related Art

U.S. Pat. No. 5,420,069 of Joshi et al. for "Method of Making Corrosion Resistant, Low Resistivity Copper for Interconnect Metal Lines" shows a "corrosion resistant thin film interconnect material, comprising a bilayer formed of a copper (Cu) film over which a layer of $Cu_3Ge$ or copper germanium (Ge) alloy has been deposited." In FIG. 3B, Joshi et al. ". . . shows Cu—Ge passivation layer 180 on all exposed surfaces of copper." This provides "excellent passivation properties". The preferred process described is "selective deposition of germanium over copper surfaces . . . exposing the original Cu layer (or surface) at a low pressure (0.5 Torr to 1 Torr) to a source of germanium, e.g. $GeH_4$ gas, in a chemical vapor deposition (CVD) reactor at temperatures ranging from about 200°–450° C. to convert the outer surface of the Cu lines to $Cu(x)Ge(y)$ or $Cu_3Ge$. . . . Any Ge containing gas source, e.g. $GeH_4$, $GeH_6$ and the like can be used. . . . It is noted that by increasing the partial pressure of $GeH_4$ more than 0.1 Torr, the $Cu(x)Ge(y)$ alloy can be changed to $Cu_3Ge$ or additional Ge can be formed." Copper "rich phases and . . . specifically $Cu_3Ge$ may also be produced by plating (electrolytic and electroless), sintered powder and sputtered bilayers which are subsequently reacted.

U.S. Pat. No. 5,283,206 of Sugano for "Method of Removing Germanium Particles Precipitated in an Aluminum/Germanium Alloy Film" shows an AlGe/Cu—Ge/Cu interconnect.

U.S. Pat. No. 5,288,456 of Aboelfotoh et al. for "Compound with Room Temperature Electrical Resistivity Comparable to that of Elemental Copper" shows a process for producing copper germanide $Cu_3Ge$ compound on the surface of a silicon substrate which had been treated by evacuation to a pressure of $1 \times 10^{-7}$ Torr for a period of time following which Ge, Ga and copper were deposited sequentially in an evacuated chamber at room temperature to avoid contact with air or oxygen. A thin film of 700 Å of germanium (Ge) was deposited on a <100> surface of the silicon substrate. Then 5–10 atomic percent of gallium (Ga) was deposited on the Ge film followed by deposition of copper (Cu) to a thickness of about 1300 Å. Then the result of the process to this point is annealed at a temperature of about 400° C. in situ for 30 minutes in vacuum. The result is a thin layer of the $Ge_3Cu$ compound with a thickness of about 2000 Å thickness on the surface which has 1–2% of Ga incorporated therein.

U.S. Pat. No. 4,931,410 of Tokunaga et al. for "Process for Producing Semiconductor Integrated Circuit Device Having Copper Interconnections and/or Wirings, and Device Produced" shows a copper (Cu) wire process.

U.S. Pat. No. 5,120,572 of Kumar for "Method of Fabricating Electrical Components in High Density Substrates" shows another copper (Cu) wire process.

U.S. Pat. No. 4,985,750 of Hoshino for "Semiconductor Device Using Copper Metallization" shows a contact with a tantalum (Ta) barrier layer.

SUMMARY OF THE INVENTION

An object of this invention is to increase the stability of a process of forming connections between copper (Cu) lines and copper via plugs.

Another object is to increase the resistance (Rc) stability of the copper via process.

The invention teaches selectively growing a copper germanide ($Cu_3Ge$) compound as a deposit on the bottom of a contact hole, followed by forming a tantalum (Ta) barrier layer over the copper germanide ($Cu_3Ge$) deposit, and then forming a copper (Cu) plug thereover.

Copper can be treated in an atmosphere of hydrogen ($H_2$) gas or hydrogen/helium ($H_2$/He) gas to reduce the copper oxide before barrier/adhesion deposition at the via stage.

In accordance with this invention, a method is provided for forming a via contact between a first copper conductor and a second copper conductor in a thin film electronic device with a copper plug interconnecting the first copper conductor and the second copper conductor. First, form a stop layer over the first copper conductor. Form a dielectric layer over the stop layer. Pattern the dielectric layer and the etch stop layer to etch an opening therethrough with a dry plasma etch down into first copper conductor leaving an exposed surface of the first copper conductor and exposed sidewalls of the dielectric layer and the etch stop layer. Grow a copper germanide ($Cu_3Ge$) compound, thin film at the base of the opening on the exposed surface of the first copper conductor from in situ exposure to germane $GeH_4$ gas. Form a barrier layer over, as follows:

a) the copper germanide ($Cu_3Ge$) compound, thin film, b) the dielectric layer; and c) the first copper conductor. The barrier layer forms a narrow via hole in the opening.

Then form the second copper conductor including the copper plug over the barrier layer, the copper plug filling the narrow via hole. Preferably, the device is exposed to in situ to germane $GeH_4$ gas at a temperature from about 200° C. to about 400° C. to form a copper germanide ($Cu_3Ge$) compound, as a thin film adhesion layer; the barrier layer comprises a metal selected from the group consisting of Ta, TaN, Ta/TaN, Ta/TaN/Ta, TaN/Ta, TiN, $WN_4$, and W.

Preferably, the device is exposed in situ to germane $GeH_4$ gas in an atmosphere of hydrogen/helium ($H_2$/He) gases at a temperature from about 200° C. to about 400° C. to form the copper germanide ($Cu_3Ge$) compound, as a thin film adhesion layer.

In accordance with another aspect of this invention, a via contact is formed between a first copper conductor and a second copper conductor in a thin film electronic device with a copper plug interconnecting the first copper conductor and the second copper conductor. There are two layers including a stop layer over the first copper conductor and a dielectric layer over the stop layer. There is an opening through the dielectric layer and the etch stop layer down into first copper conductor leaving an exposed surface of the first copper conductor with a copper germanide ($Cu_3Ge$) compound, thin film at the base of the opening on the exposed surface of the first copper conductor. A barrier layer is formed over as follows:

a) the copper germanide ($Cu_3Ge$) compound, thin film;

b) the dielectric layer and c) the first copper conductor.

The barrier layer forms a narrow via hole in the opening, and the second copper conductor includes the copper plug over the barrier layer, the copper plug filling the narrow via hole. The copper germanium thin film comprises a copper germanide ($Cu_3Ge$) compound, formed as a thin film adhesion layer, and the barrier layer comprises a metal selected from the group consisting of Ta, TaN, Ta/TaN, Ta/TaN/Ta, TaN/Ta, TiN, $WN_4$, and W.

An advantage of this invention is that without lowering copper conductivity excessively, only a copper germanide $Cu_3Ge$ compound is formed at the base of a via hole above a copper conductor below.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The invention teaches selective growth of a copper germanide $Cu_3Ge$ compound on the bottom of a contact via hole, then forming a tantalum (Ta) barrier layer, and forming a copper (Cu) plug over the tantalum (Ta) barrier layer. The $Cu_3Ge$ compound reduces any copper oxide which exists on the copper substrate and exhibits good resistance to oxidation.

Figure 1A:
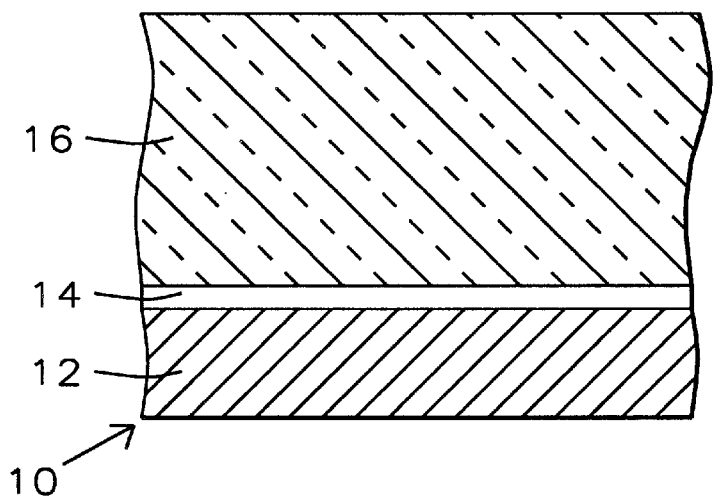
FIGS. 1A–1F show a series of sectional views illustrating the method of manufacturing a fragment of semiconductor device on a substrate in the form of a copper conductor to which a copper connection is to be made in accordance with the process of this invention.

FIG. 1A shows a sectional view of a fragment semiconductor device 10 comprising a substrate in the form of a copper conductor 12 to which a copper connection is to be made in accordance with the process of this invention. Above the copper conductor 12 a thin silicon nitride ($Si_3N_4$) stop layer 14 has been formed. Above silicon nitride ($Si_3N_4$) stop layer 14, a thick layer of a silicon oxide dielectric layer 16 has been formed.

Figure 1B:
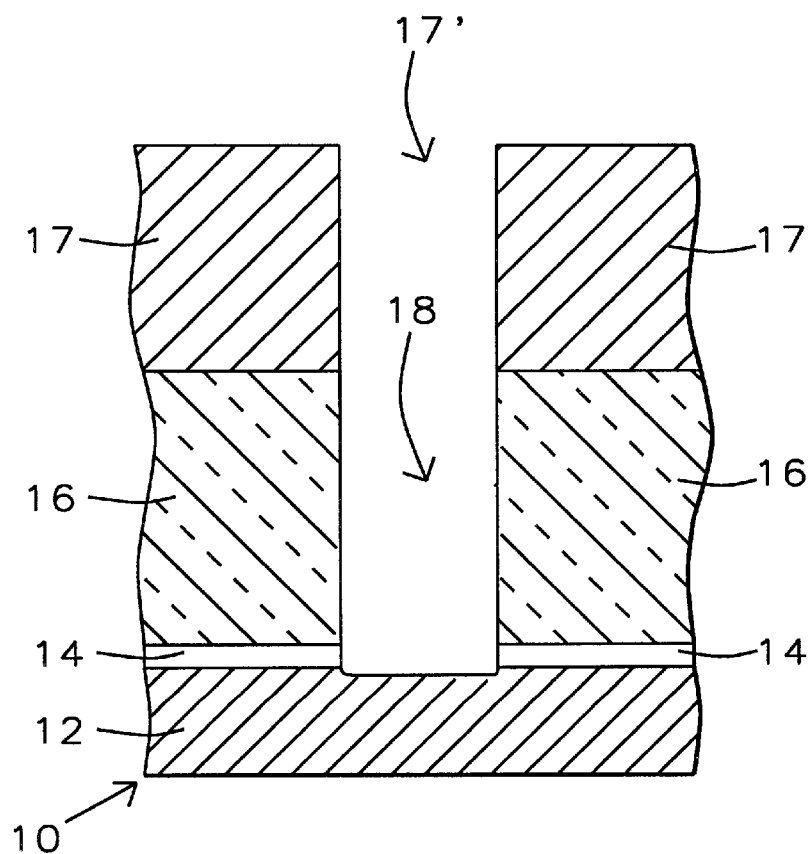

FIG. 1B shows the device 10 of FIG. 1A after a photoresist mask has been formed with an opening 17' therethrough down to the surface of silicon oxide dielectric layer 16 through which an opening 18 has been etched by dry plasma etching. Hole 18 reaches down through silicon nitride ($Si_3N_4$) stop layer 14 to slightly below the surface of copper conductor 12.

Figure 1C:
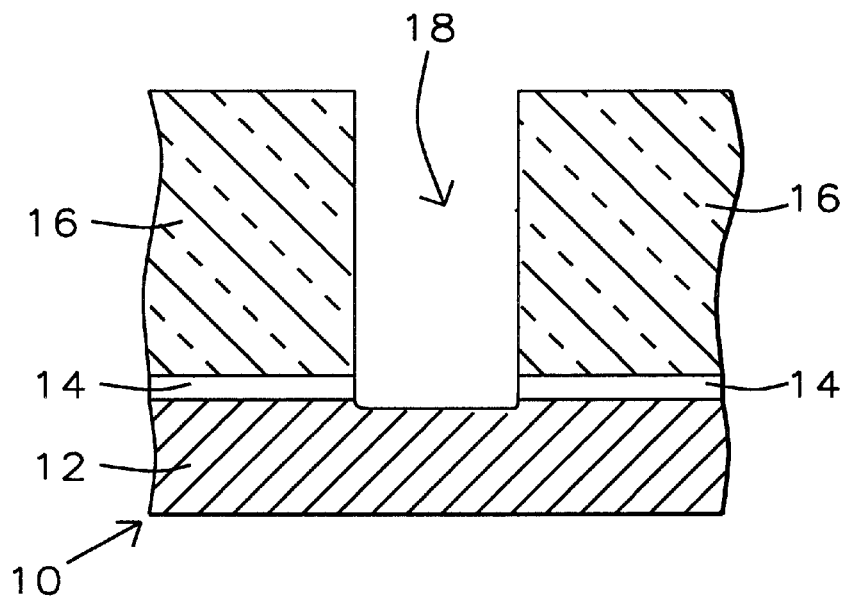

FIG. 1C shows the device 10 of FIG. 1B after the photoresist mask 17 has been stripped from the device 10 leaving the surface of silicon oxide dielectric layer 16 and the top of opening 18 exposed.

Figure 1D:
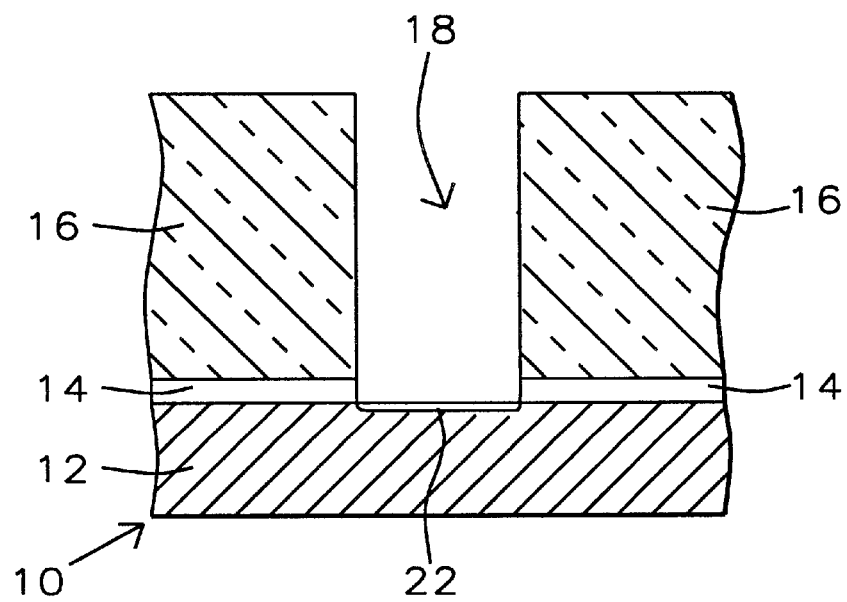

FIG. 1D shows the device 10 of FIG. 1C after a copper germanium thin film adhesion layer 22 has been formed selectively at the base of opening 18 in the surface of copper conductor 12. Preferably copper germanium thin film adhesion layer 22 comprises copper germanide ($Cu_3Ge$) compound, to which reference is made hereinbelow as the preferred embodiment. In summary, the copper germanium, thin film adhesion layer 22 is selectively grown in the opening 18 to form an upon which a barrier layer 20 is formed in FIG. 1E.

The selective growth of the copper germanide compound is performed by introducing into the chamber in situ of germane $GeH_4$ gas at a temperature from about 200° C. to about 400° C. to form a copper germanide ($Cu_3Ge$) compound, as thin film adhesion layer 22. Growth of the copper germanide compound can be performed following introduction into the chamber containing device 10 of hydrogen/helium ($H_2/He$) gas for reduction of any oxide which exists on the copper substrate 12 juxtaposed with the copper germanide ($Cu_3Ge$) compound, thin film adhesion layer 22.

Figure 1E:
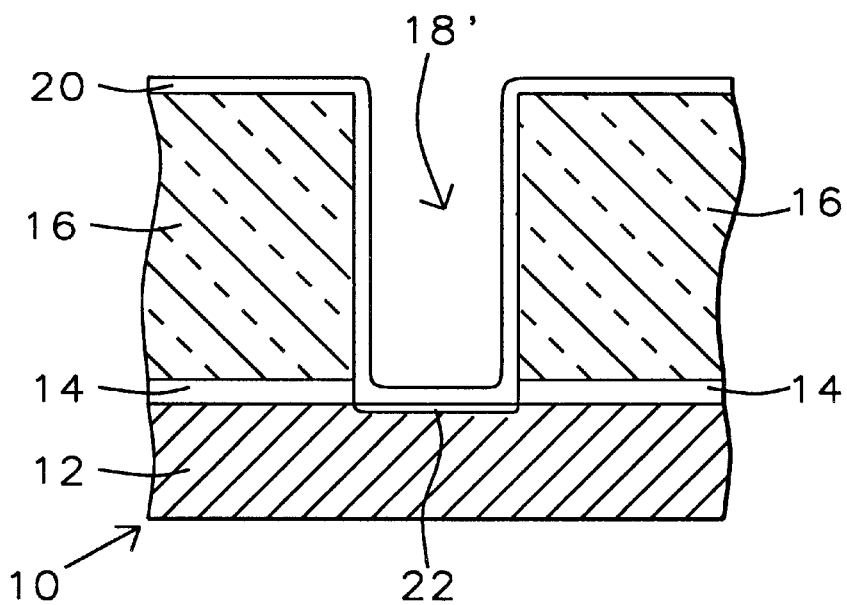

FIG. 1E shows the device 10 of FIG. 1D after forming a blanket tantalum (Ta) barrier layer 20 over the copper germanide ($Cu_3Ge$) compound, thin film adhesion layer 22 and the dielectric layer 16 as well as covering the exposed surfaces in the hole 18. In hole 18 layer 20 covers the copper germanide ($Cu_3Ge$) compound, thin film adhesion layer 22 and layer 20 also covers the exposed edges of the etch stop layer 14 as well as the walls in hole 18 of the dielectric layer 16. Barrier layer 20 partially fills the via hole 18 making a narrower hole 18' within the via hole 18 and covering the copper germanide ($Cu_3Ge$) compound, thin film adhesion layer 22. The barrier layer 20 comprises a metal selected from the group consisting of Ta (tantalum), TaN (tantalum nitride), Ta/TaN, Ta/TaN/Ta, TaN/Ta, TiN (titanium nitride), $WN_4$ (tungsten nitride), and W (tungsten).

Figure 1F:
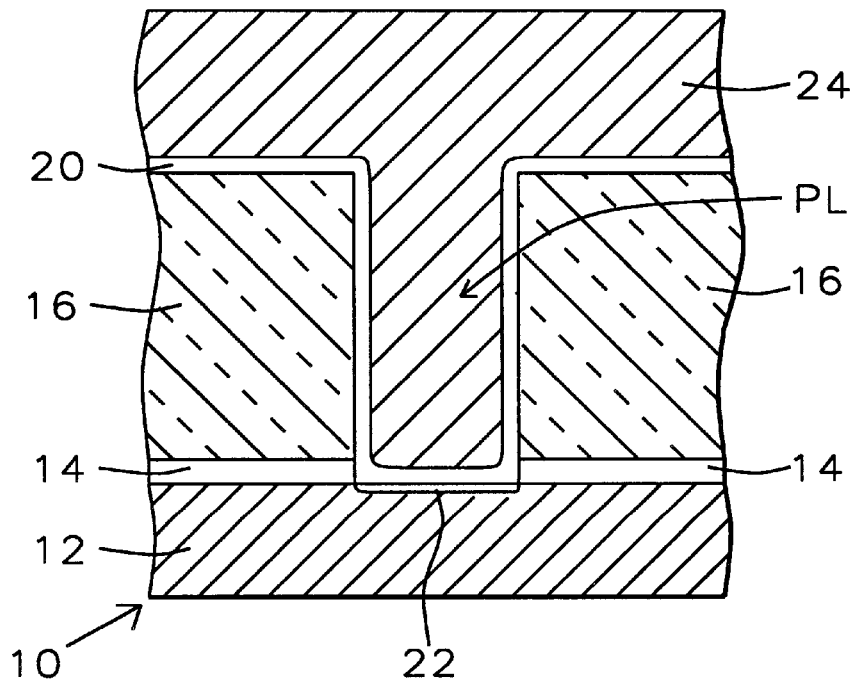

FIG. 1F shows the device 10 of FIG. 1E after forming a blanket second copper conductor 24 over the barrier layer 20. Conductor 24 includes a copper plug PL, which is formed in the via hole 18' over and inside the barrier layer 20.

SUMMARY

After via etching through a silicon nitride ($Si_3N_4$) stop layer 24 and then photoresist stripping, a copper germanide ($Cu_3Ge$) thin film adhesion layer 22 is selectively grown in the via hole 18 followed $H_2/He$ reduction of any copper oxide which exists on the copper substrate 12. Then a barrier/adhesion tantalum layer 20 is formed over the device 10 including the copper germanide thin film adhesion layer 22, and finally a blanket copper (Cu) layer fills the via hole 18' lined with a tantalum layer 20 which is formed in a cluster tool.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a via contact between a first copper conductor and a second copper conductor in a thin film electronic device with a copper plug interconnecting said first copper conductor and said second copper conductor comprising:

forming a stop layer over said first copper conductor, forming a dielectric layer over said stop layer, patterning said dielectric layer and said etch stop layer to etch a hole therethrough down into first copper conductor leaving an exposed surface of said first copper conductor and exposed sidewalls of said dielectric layer and said etch stop layer, growing a copper germanium thin film at the base of said hole on the exposed surface of said first copper conductor, forming a barrier layer over, as follows:
  a) said copper germanium thin film,
  b) said dielectric layer, and
  c) said first copper conductor, said barrier layer forming a narrow via hole in said hole, and forming said second copper conductor including said copper plug over said barrier layer, said copper plug filling said narrow via hole.

2. The method of claim 1, wherein:
said device is exposed to in situ germane $GeH_4$ gas to form said copper germanium film.

3. The method of claim 1, wherein:
said device is exposed to in situ germane $GeH_4$ gas at a temperature from about 200° C. to about 400° C. to form a copper germanide ($Cu_3Ge$) compound, as a thin film adhesion layer.

4. The method of claim 1, wherein:
said device is exposed to in situ germane $GeH_4$ gas to form said copper germanium film, and
said barrier layer comprises a metal selected from the group consisting of tantalum, (Ta), TaN, Ta/TaN, Ta/TaN/Ta, TaN/Ta, TiN, $WN_4$, and W (tungsten).

5. The method of claim 1, wherein said device is exposed to in situ germane $GeH_4$ gas at a temperature from about 200° C. to about 400° C., in an atmosphere of hydrogen/helium ($H_2$/He) gases at a temperature from about 200° C. to about 400° C. to form a copper germanide ($Cu_3Ge$) compound, as a thin film adhesion layer, and
said barrier layer comprises a metal selected from the group consisting of tantalum, (Ta), TaN, Ta/TaN, Ta/TaN/Ta, TaN/Ta, TiN, $WN_4$, and W (tungsten).

6. A method of forming a via contact between a first copper conductor and a second copper conductor in a thin film electronic device with a copper plug interconnecting said first copper conductor and said second copper conductor comprising:
forming a stop layer over said first copper conductor,
forming a dielectric layer over said stop layer,
patterning said dielectric layer and said etch stop layer to etch a hole therethrough with a dry plasma etch down into first copper conductor leaving an exposed surface of said first copper conductor and exposed sidewalls of said dielectric layer and said etch stop layer,
growing a copper germanide ($Cu_3Ge$) compound, thin film at the base of said hole on the exposed surface of said first copper conductor from in situ exposure to germane $GeH_4$ gas,
forming a barrier layer over, as follows:
 a) said copper germanide ($Cu_3Ge$) compound, thin film,
 b) said dielectric layer and
 c) said first copper conductor,
said barrier layer forming a narrow via hole in said hole, and
forming said second copper conductor including said copper plug over said barrier layer, said copper plug filling said narrow via hole.

7. The method of claim 6, wherein:
said device is exposed to in situ germane $GeH_4$ gas to form said copper germanide film.

8. The method of claim 6, wherein:
said device is exposed to in situ germane $GeH_4$ gas at a temperature from about 200° C. to about 400° C. to form a copper germanide ($Cu_3Ge$) compound, as a thin film adhesion layer.

9. The method of claim 6, wherein:
said device is exposed to in situ germane $GeH_4$ gas to form said copper germanide film, and
said barrier layer comprises a metal selected from the group consisting of tantalum, (Ta), TaN, Ta/TaN, Ta/TaN/Ta, TaN/Ta, TiN, $WN_4$, and W (tungsten).

10. The method of claim 6, wherein said device is exposed to in situ to germane $GeH_4$ gas at a temperature from about 200° C. to about 400° C., in an atmosphere of hydrogen/helium ($H_2$/He) gases to form a copper germanide ($Cu_3Ge$) compound, as a thin film adhesion layer, and
said barrier layer comprises a metal selected from the group consisting of tantalum, (Ta), TaN, Ta/TaN, Ta/TaN/Ta, TaN/Ta, TiN, $WN_4$, and W (tungsten).

11. A via contact between a first copper conductor and a second copper conductor in a thin film electronic device with a copper plug interconnecting said first copper conductor and said second copper conductor comprising:
a stop layer over said first copper conductor,
a dielectric layer over said stop layer,
a hole through said dielectric layer and said etch stop layer down into first copper conductor with a copper germanium thin film at the base of said hole on the exposed surface of said first copper conductor,
a barrier layer formed over, as follows:
 a) said copper germanium thin film,
 b) said dielectric layer, and
 c) said first copper conductor,
said barrier layer forming a narrow via hole in said hole, and
said second copper conductor including said copper plug over said barrier layer, and said copper plug filling said narrow via hole.

12. The device of claim 11, wherein:
said copper germanium thin film comprises a copper germanide ($Cu_3Ge$) compound, as a thin film adhesion layer.

13. The device of claim 11, wherein:
said copper germanium thin film comprises a copper germanide ($Cu_3Ge$) compound, as a thin film adhesion layer, and
said barrier layer comprises a metal selected from the group consisting of tantalum, (Ta), TaN, Ta/TaN, Ta/TaN/Ta, TaN/Ta, TiN, $WN_4$, and W (tungsten).

14. A via contact between a first copper conductor and a second copper conductor in a thin film electronic device with a copper plug interconnecting said first copper conductor and said second copper conductor comprising:
a stop layer over said first copper conductor,
a dielectric layer over said stop layer,
a hole through said dielectric layer and said etch stop layer down into first copper conductor leaving an exposed surface of said first copper conductor with a copper germanide ($Cu_3Ge$) compound, thin film at the base of said hole on the exposed surface of said first copper conductor,
a barrier layer formed over, as follows:
 a) said copper germanide ($Cu_3Ge$) compound, thin film,
 b) said dielectric layer, and
 c) said first copper conductor,
said barrier layer forming a narrow via hole in said hole, and
said second copper conductor including said copper plug over said barrier layer, said copper plug filling said narrow via hole.

15. The device of claim 14, wherein:
said copper germanium thin film comprises a copper germanide ($Cu_3Ge$) compound, formed as a thin film adhesion layer, and
said barrier layer comprises a metal selected from the group consisting of tantalum, (Ta), TaN, Ta/TaN, Ta/TaN/Ta, TaN/Ta, TiN, $WN_4$, and W (tungsten).

* * * * *